(12) United States Patent
 Chalupczak et al.

(10) Patent No.: US 11,747,302 B2
(45) Date of Patent: Sep. 5, 2023

(54) METHOD AND SYSTEM FOR DETECTING A MATERIAL RESPONSE

(71) Applicants: NPL Management Limited, Middlesex (GB); The University of Strathclyde, Scotland (GB)

(72) Inventors: Witold Chalupczak, Bracknell (GB); Rafal Gartman, London (GB); Patrick Bevington, London (GB)

(73) Assignees: NPI Management Limited; The University of Strathclyde

( * ) Notice: Subject to any disclaimer, the term of this patent is extended or adjusted under 35 U.S.C. 154(b) by 0 days.

(21) Appl. No.: 17/261,336

(22) PCT Filed: Jul. 11, 2019

(86) PCT No.: PCT/GB2019/051953
§ 371 (c)(1),
(2) Date: Jan. 19, 2021

(87) PCT Pub. No.: WO2020/016557
PCT Pub. Date: Jan. 23, 2020

(65) Prior Publication Data
US 2021/0278371 A1 Sep. 9, 2021

(30) Foreign Application Priority Data

Jul. 20, 2018 (GB) .................................... 1811928
Aug. 24, 2018 (GB) .................................... 1813858

(51) Int. Cl.
*G01N 27/82* (2006.01)
(52) U.S. Cl.
CPC .................. *G01N 27/82* (2013.01)

(58) Field of Classification Search
CPC ....... G01N 27/82; G01N 24/006; G01R 33/26
See application file for complete search history.

(56) References Cited

U.S. PATENT DOCUMENTS

| 7,521,928 B2 | 4/2009 | Romalis |
| 8,212,556 B1 * | 7/2012 | Schwindt ............... G01R 33/26 324/304 |
| 8,970,217 B1 | 3/2015 | Kadin |

(Continued)

FOREIGN PATENT DOCUMENTS

JP 2015121409 7/2015

OTHER PUBLICATIONS

W. Chalupczak et al.; Room Temperature Femtotesla Radio-Frequency Atomic Magnetometer; Applied Physics Letters; vol. 100; 2012.

(Continued)

*Primary Examiner* — Dominic E Hawkins
(74) *Attorney, Agent, or Firm* — Heisler & Associates

(57) ABSTRACT

Disclosed herein is a method of detecting a material response. The method includes providing an oscillating primary magnetic field to cause as ample to produce a secondary magnetic field. The method also includes reducing the effect on an atomic magnetometer of components of the primary and secondary magnetic fields in a direction substantially orthogonal to a surface of the sample. The method also includes detecting the secondary magnetic field with the atomic magnetometer to detect the material response.

10 Claims, 13 Drawing Sheets

(56) References Cited

U.S. PATENT DOCUMENTS

| | | | | |
|---|---|---|---|---|
| 9,857,441 B2* | 1/2018 | Salit | ................ | G01R 33/26 |
| 9,903,925 B2* | 2/2018 | Kim | ................ | G01R 33/36 |
| 9,995,800 B1* | 6/2018 | Schwindt | ................ | H03L 7/26 |
| 2005/0206377 A1* | 9/2005 | Romalis | ................ | G01R 33/02 |
| | | | | 324/301 |
| 2008/0106261 A1 | 5/2008 | Romalis | | |
| 2010/0289491 A1* | 11/2010 | Budker | ................ | G01R 33/26 |
| | | | | 324/304 |
| 2015/0008916 A1* | 1/2015 | Le Prado | ................ | G01R 33/04 |
| | | | | 324/304 |
| 2016/0116553 A1* | 4/2016 | Kim | ................ | G01R 33/032 |
| | | | | 324/304 |
| 2017/0023653 A1 | 1/2017 | Kobayashi | | |

OTHER PUBLICATIONS

Arne Wickenbrock et al.; Magnetic Induction Tomography Using an All-Optical 87Rb Atomic Magnetometer; Optics Letters; vol. 39; pp. 6367-6370; 2014.

Luca Marmugi et al.; Magnetic Induction Imaging with Optical Atomic Magnetometers: Towards Applications to Screening and Surveillance; Visual Communications and Image Processing; vol. 9652; 2015.

Giuseppe Bevilacqua et al.; Multichannel Optical Atomic Magnetometer Operating in Unshielded Environment; University of Siena; 2016.

Arne Wickenbrock et al.; Eddy Current Imaging with an Atomic Radio-Frequency Magnetometer; Applied Physics Letters; vol. 108; 2016.

Cameron Deans et al.; Electromagnetic Induction Imaging with a Radio-Frequency Atomic Magnetometer; Applied Physics Letters; vol. 108; 2016.

Cameron Deans et al.; Through-Barrier Electromagnetic Imaging with an Atomic Magnetometer; Optics Express; vol. 25; 2017.

Ennio Arimondo et al.; Advances in Atomic, Molecular, and Optical Physics; vol. 67; 2018.

Cameron Deans et al.; Machine Learning Based Localization and Classification with Atomic Magnetometers; Physical Review Letters; vol. 120; 2018.

Cameron Deans et al.; Active Underwater Detection with an Array of Atomic Magnetometers; Applied Optics; vol. 57; 2018.

* cited by examiner

METHOD AND SYSTEM FOR DETECTING A MATERIAL RESPONSE

Method and System for Detecting a Material Response

The invention relates to method and systems for detecting a material response.

Aspects of the invention seek to provide an improved method and system for detecting a material response.

According to an aspect of the invention, there is provided a method of detecting a material response, including:
providing an oscillating primary magnetic field to cause the sample to produce a secondary magnetic field;
reducing the effect on an atomic magnetometer of components of the primary and secondary magnetic fields in a direction substantially orthogonal to a surface of a sample;
detecting the secondary magnetic field with the atomic magnetometer to detect the material response.

According to an aspect of the invention, there is provided a system for detecting a material response, including:
a magnetic field source for providing an oscillating primary magnetic field to cause a sample to produce a secondary magnetic field;
an atomic magnetometer for detecting the secondary magnetic field for detecting a material response;
wherein the system is configured to reduce the effect on the atomic magnetometer of components of the primary and secondary magnetic fields in a primary direction substantially orthogonal to a surface of the sample.

Optional features of embodiments of the invention are provided in the dependent claims.

According to an aspect of the invention, there is provided a method of detecting a material response, including:
providing an oscillating primary magnetic field to cause a sample to produce a secondary magnetic field;
modulating a bias magnetic field of an atomic magnetometer;
detecting the secondary magnetic field with the atomic magnetometer to detect the material response.

In some embodiments, a frequency of oscillation of the primary magnetic field is fixed.

In some embodiments, a frequency of modulation of the bias magnetic field is less, preferably by an order of magnitude, than a frequency of oscillation of the primary magnetic field.

In some embodiments the method includes demodulating a signal, provided by the atomic magnetometer in response to detection of the secondary magnetic field, to determine an amplitude and/or a phase.

In some embodiments the method includes demodulating a signal, provided by the atomic magnetometer in response to detection of the secondary magnetic field, with reference to a frequency of oscillation of the primary magnetic field, to provide a partially demodulated signal.

In some embodiments the method includes demodulating the partially demodulated signal with reference to a frequency of modulation of the bias magnetic field to determine an amplitude and/or phase of a signal provided by the atomic magnetometer in response to detection of the secondary magnetic field.

According to an aspect of the invention, there is provided a system for detecting a material response, including:
an atomic magnetometer for detecting a secondary magnetic field for detecting a material response, the atomic magnetometer including a bias magnetic field source for providing a bias magnetic field;
a modulator for modulating the bias magnetic field.

In some embodiments the system includes a primary magnetic field source for providing an oscillating primary magnetic field.

In some embodiments the system includes a demodulator arrangement for determining an amplitude and/or phase of a signal, provided by the atomic magnetometer in response to detection of the secondary magnetic field.

In some embodiments, the demodulator arrangement includes a receiver for receiving a signal provided by the atomic magnetometer in response to detection of the secondary magnetic field and is configured to demodulate the signal with reference to a frequency of oscillation of a or the primary magnetic field to provide a partially demodulated signal.

In some embodiments, the demodulator arrangement includes a receiver for receiving a modulation signal from the modulator and is configured to demodulate the partially demodulated signal with reference to the modulation signal to allow determination of an amplitude and/or phase of the partially demodulated signal.

In some embodiments, the bias magnetic field source includes a coil arrangement.

The methods of the independent method claim and of other aspects of the invention, and optionally also the features of any one or more of the dependent claims and/or optional features of aspects of the invention, can be combined in some embodiments of the invention.

The systems of the independent system claim and of other aspects of the invention, and optionally also the features of any one or more of the dependent claims and/or optional features of aspects of the invention, can be combined in some embodiments of the invention.

The material response can be a response of the sample to the primary magnetic field and this may include atomic response, magnetisation, eddy currents, and other responses. The secondary magnetic field can be indicative of the material response and in some embodiments the material response can include or be the secondary magnetic field.

Providing a compensatory magnetic field can include operating a compensation coil arrangement to produce the compensatory magnetic field.

In some embodiments, the method can include varying or tuning one or more distances from a detection cell of the atomic magnetometer of one or more coils of the compensation coil arrangement, so as to reduce the effect on the atomic magnetometer of one or more components of the primary and/or secondary magnetic fields. For example, to reduce the effect on the atomic magnetometer of any component of the primary and/or secondary magnetic field, the method can include varying or tuning a distance from the detection cell of a compensation coil having an axis in a direction of that component.

Preferably, the compensatory magnetic field is an oscillating magnetic field.

Preferably, the compensatory magnetic field is made to oscillate with the same frequency as the primary magnetic field to keep a constant phase difference therebetween.

Providing an oscillating primary magnetic field substantially orthogonal to the surface of the sample to cause the sample to produce a secondary magnetic field can include operating an rf coil arrangement to provide the primary magnetic field.

In embodiments, the magnetic field source for providing an oscillating primary magnetic field includes an rf coil with or without a solid core.

In embodiments, the primary magnetic field is oscillated at an rf frequency, for example in the range 1 Hz to 1 GHz.

In some embodiments, the magnetic field source for providing an oscillating primary magnetic field can be configured to be disposed entirely on one side of a sample surface.

In some embodiments, the system can be configured to be disposed entirely on one side of the sample surface.

The method and/or system can be for detecting a material response for a variety of purposes, for example for material defects imaging and/or for detecting material electrical conductivity and magnetic permeability. In some embodiments the method and/or can be used for corrosion under insulation detection (CUI). In some embodiments, the method and/or system can be used for detection of the condition of reinforced concrete structures. In some embodiments, the method and/or system can be used for localisation of objects.

In embodiments, the atomic magnetometer is a radio-frequency atomic magnetometer.

In some embodiments, the sample has a high magnetic permeability and the secondary magnetic field is dominated by the secondary magnetisation. However, in other embodiments (highly conductive samples), the secondary magnetic field is dominated by the field generated by eddy currents.

Some embodiments can provide improving of material defects imaging with a radio-frequency atomic magnetometer Embodiments of the invention are described below, by way of example only, with reference to the accompanying drawings.

Figure 3:
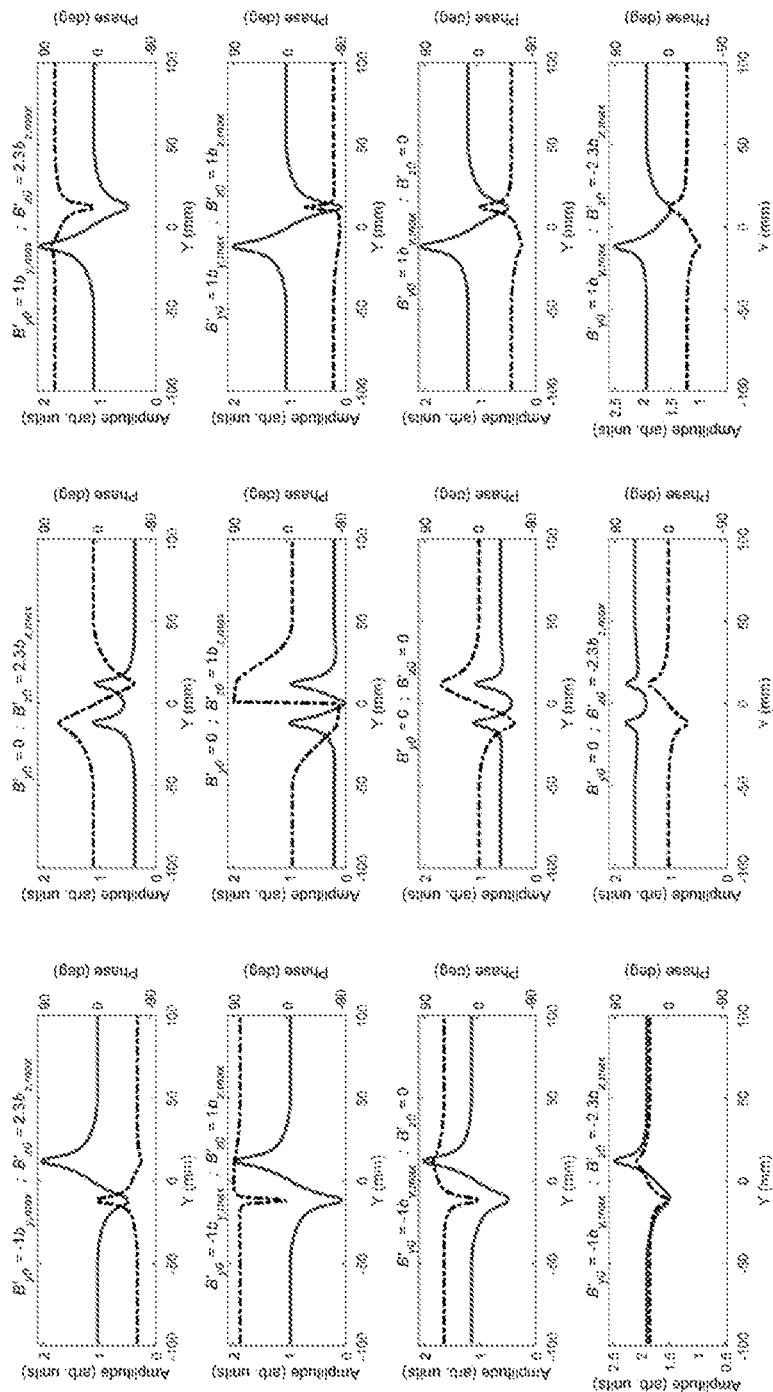
Figure 4:
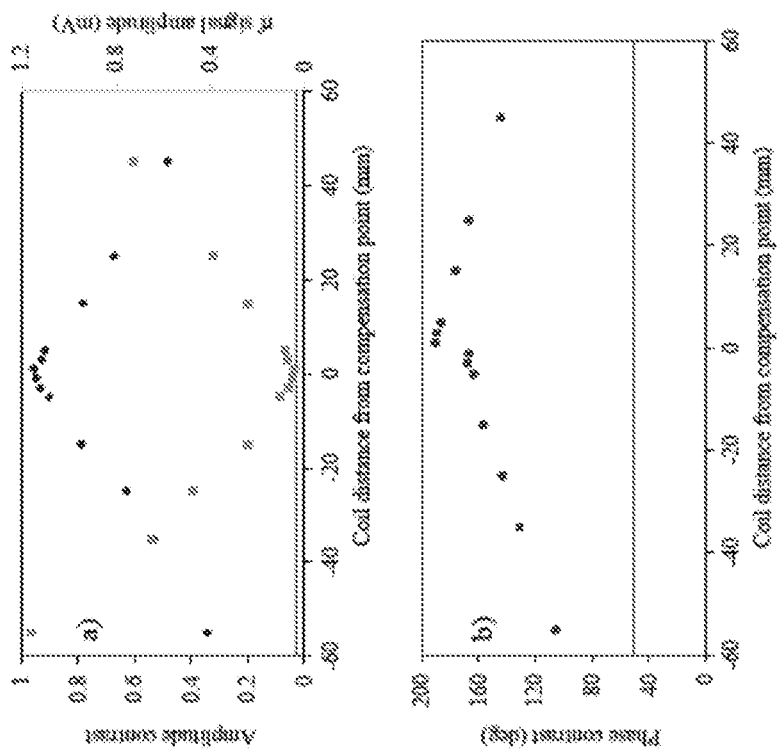

FIG. 3 shows a modelled change in the signal phase (dotted black line) and the amplitude (solid red line) of the magnetic resonance signal over a recess recorded by a magnetometer for various amplitudes of the primary field components. The vertical axis of the image array represents changes in the vertical component, while the horizontal axis represents changes in the horizontal component of the primary field. Amplitude expressed in units of $b_{y,max}$ and $b_{z,max}$ FIG. 4 shows (a) Amplitude and (b) phase contrast measured for different locations of a vertical coil (compensation coil above the vapour cell) from the compensation point. For each position of the vertical coil, position of the horizontal coil was adjusted to achieve symmetric profile. Green squares in (a) represent change of the rf spectroscopy signal amplitude. Solid blue/red line shows the amplitude/phase contrast in an absence of the compensation field.

Figure 5:
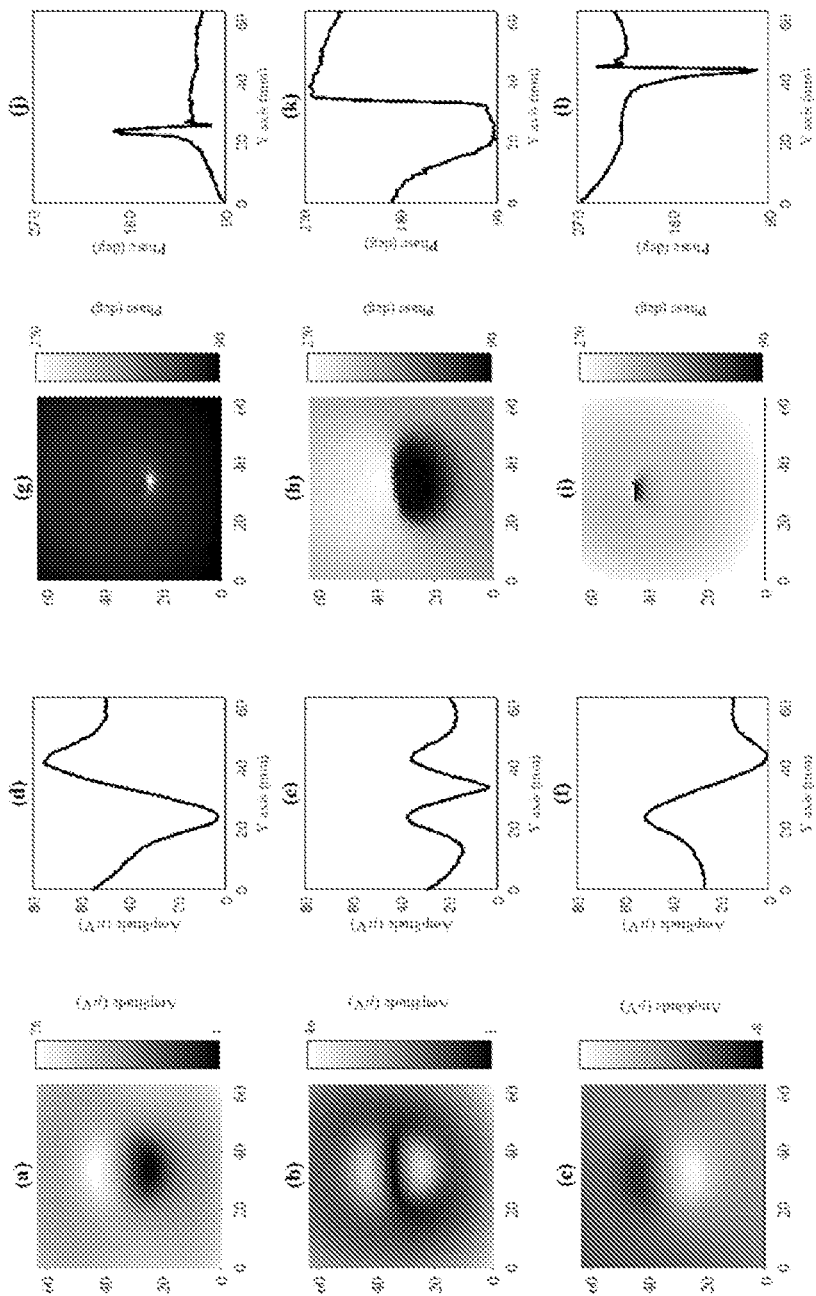

FIG. 5:
(a)-(c)/(g)-(i): The measured change of the amplitude/ phase of the rf spectroscopy signal over a 64×64 mm² area of a 6 mm thick carbon steel plate, containing a 24 mm diameter recess that is 2.4 mm deep, recorded for three values of the horizontal component of the compensation rf field around compensation point.
(d)-(f)/(j)-(l): The vertical cross-sections through the centre of the amplitude/phase images.

The images have been recorded at 114.2 kHz.

Figure 6:
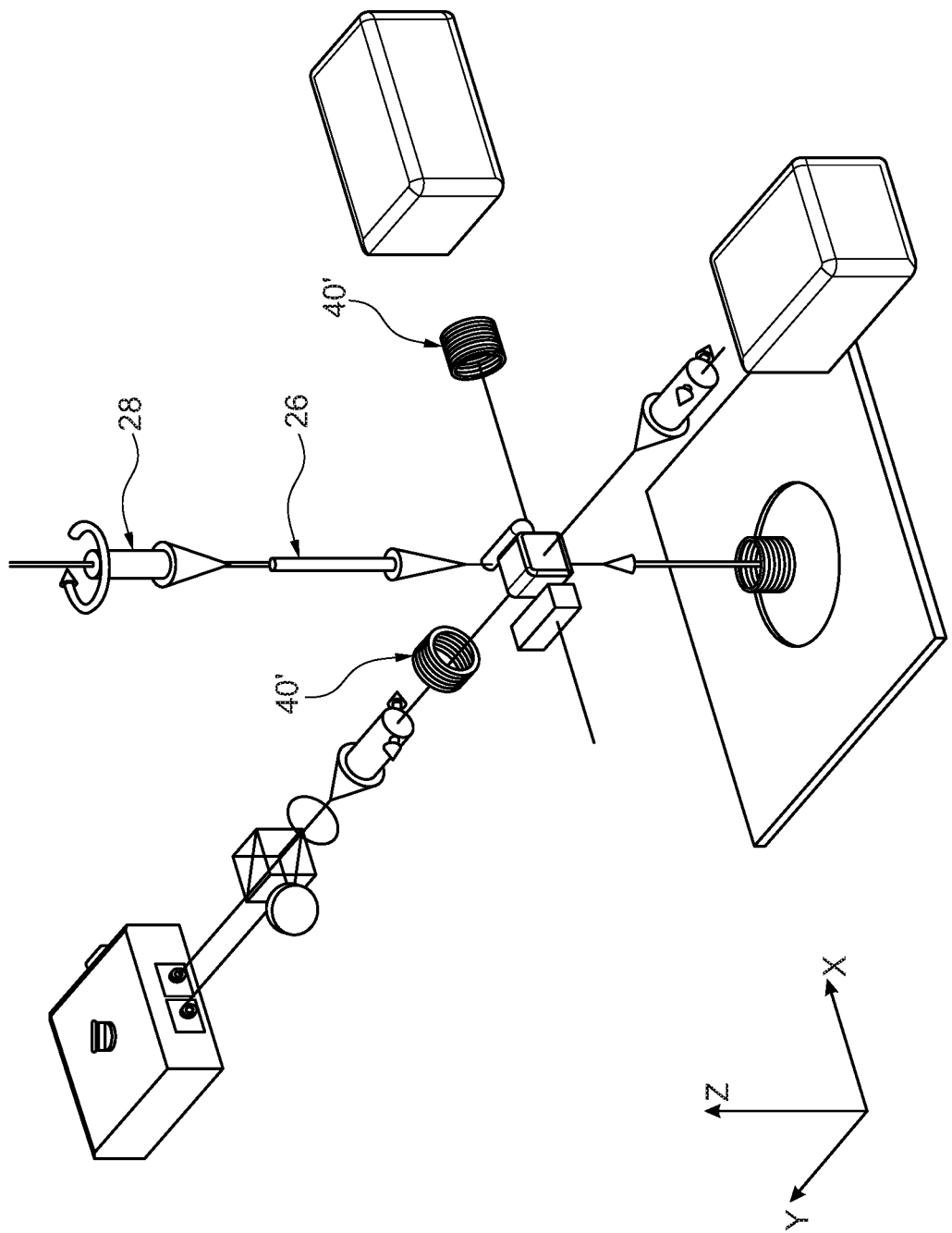

FIG. 6 shows an experimental setup according to another embodiment of the invention.

Figure 7:
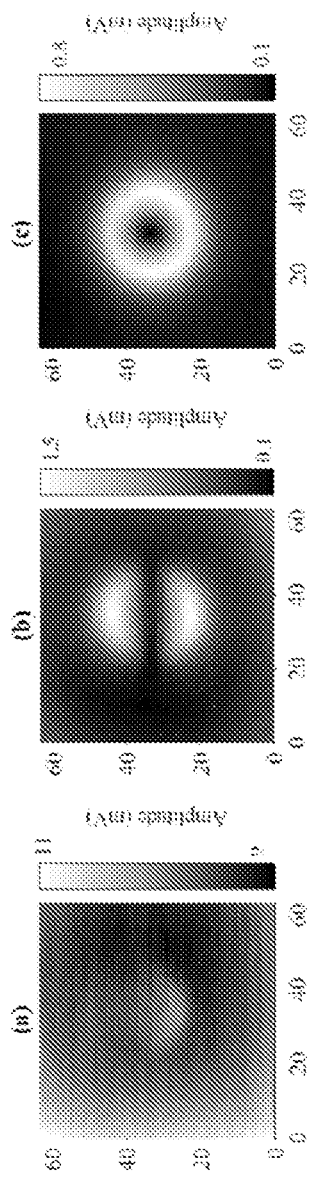

FIG. 7 shows the measured change of the amplitude of rf spectroscopy signal over a 64×64 mm² area of a 6 mm thick Al plate containing a 24 mm diameter recess that is 2.4 mm deep recorded with three measurement configurations: (a) without rf field compensation, (b) with compensation performed with two rf coils (FIG. 1), (c) and with rotated bias magnetic field and compensation coils (FIG. 6).

Figure 8:
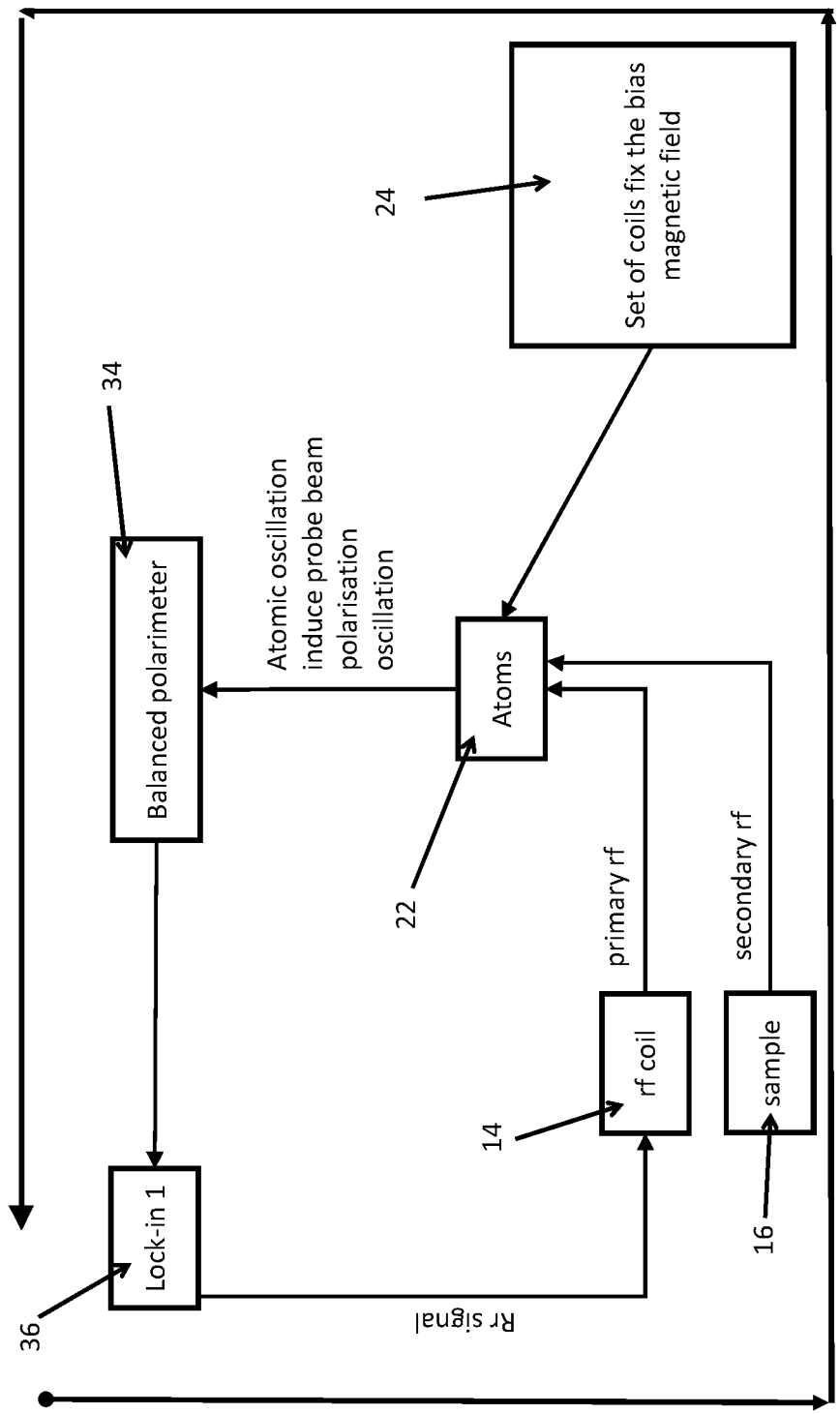

FIG. 8 is a system diagram of an embodiment of the invention.

Figure 9:
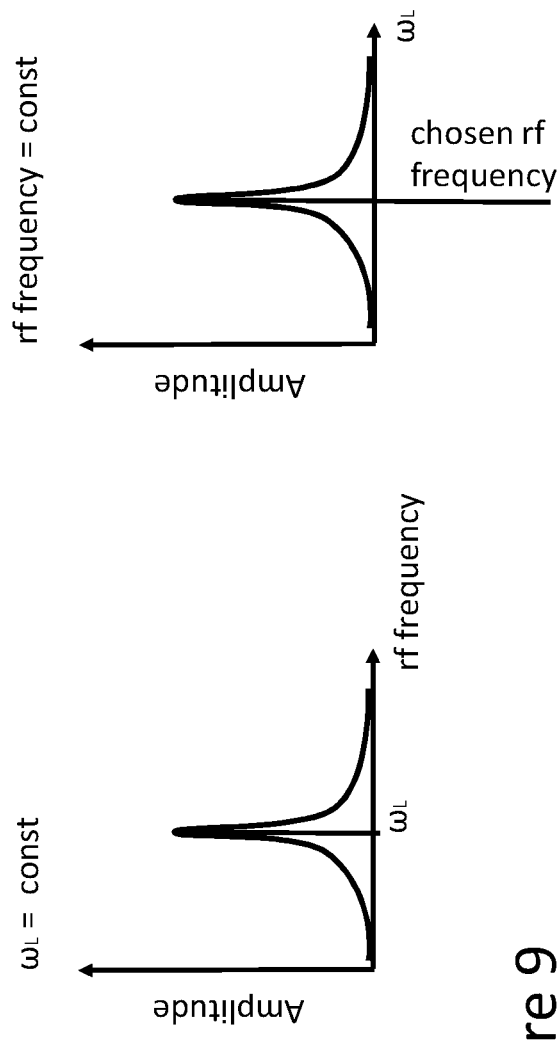

FIG. 9 shows graphs of scanning.

Figure 10:
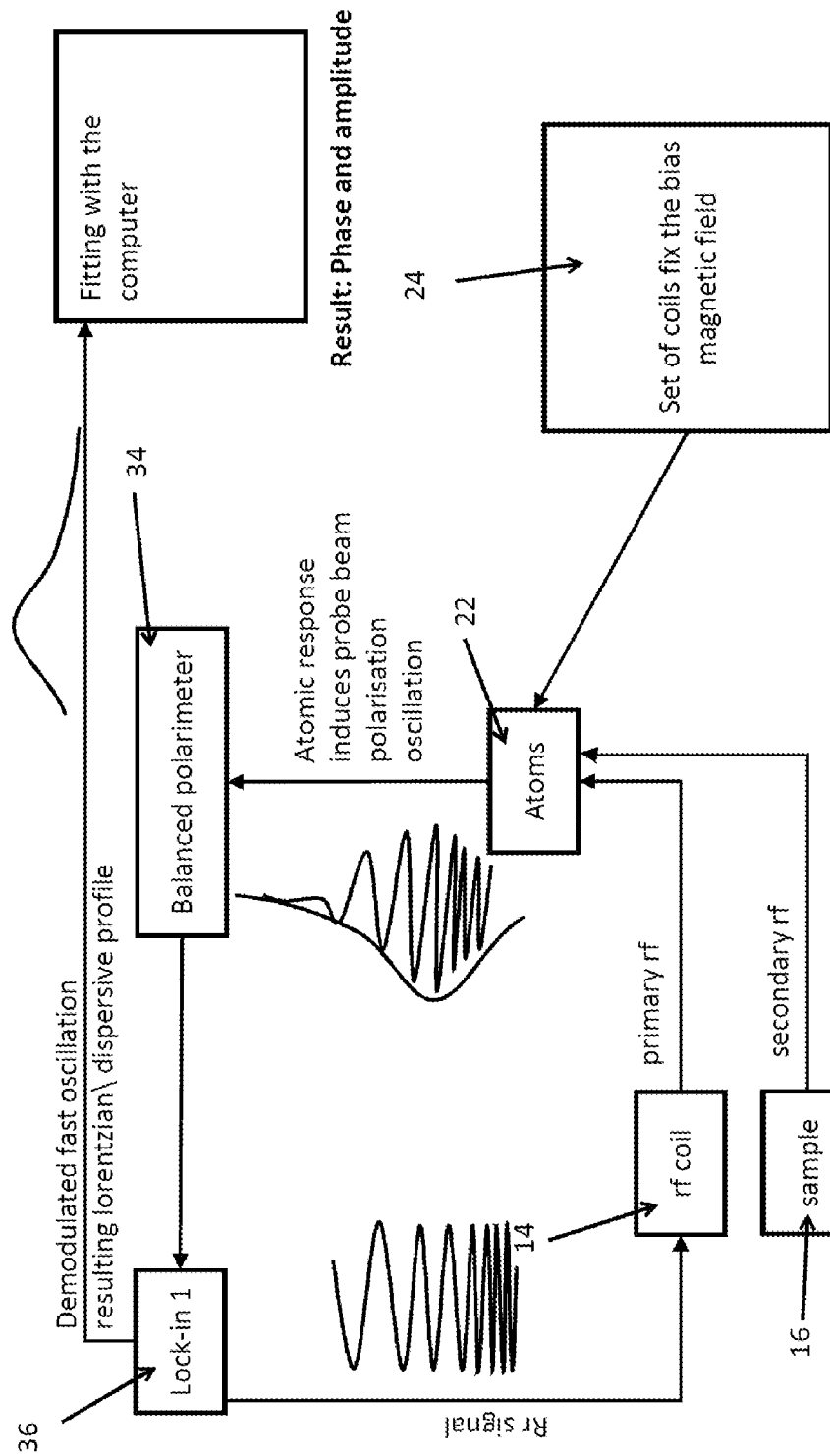
Figure 11:
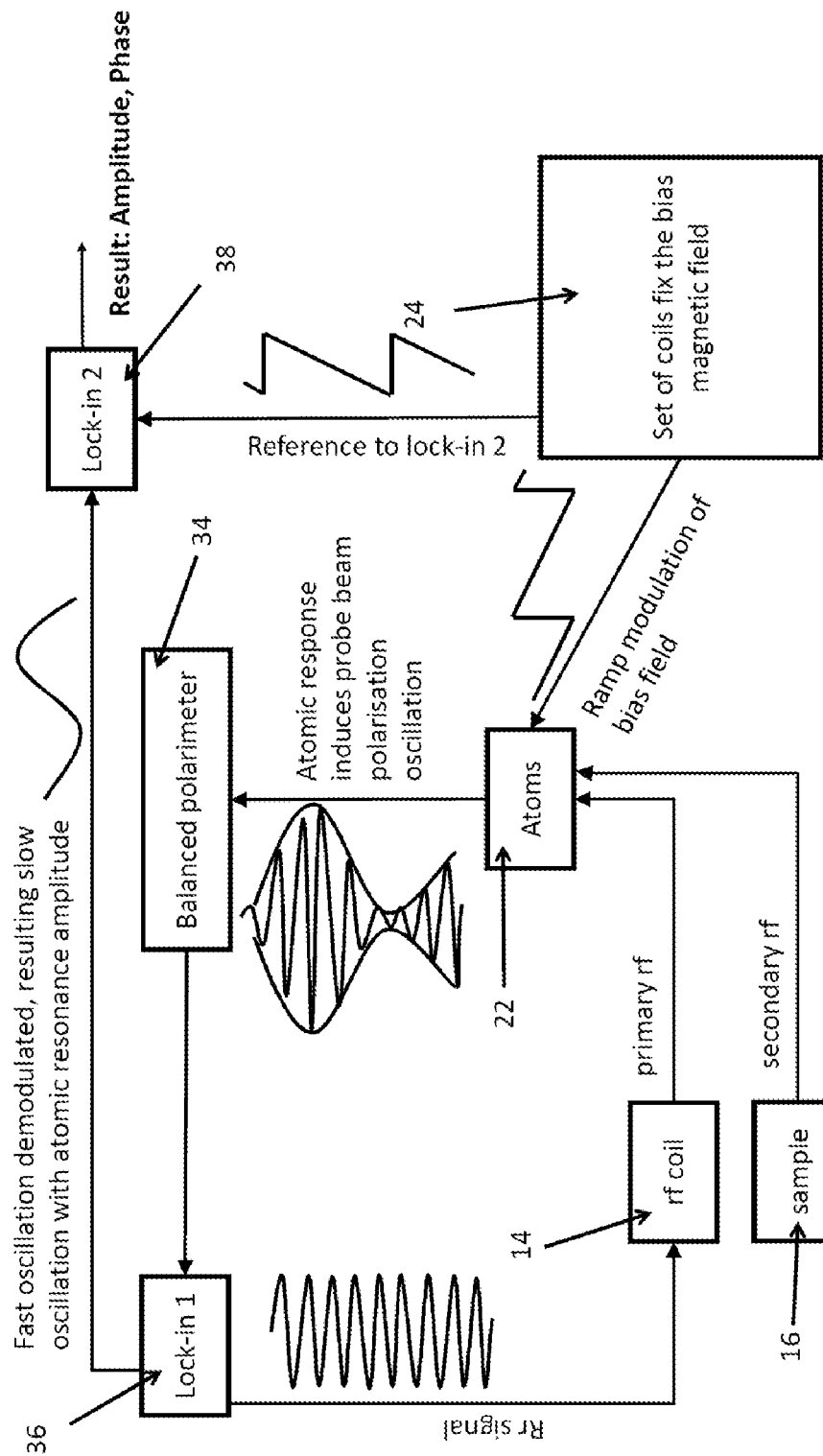

FIGS. 10 and 11 are system diagrams of embodiments of the invention.

In embodiments of the invention, imaging of the structural defects can be realized with radio-frequency atomic magnetometer by recording a material response to the radio-frequency excitation field. Described below are two examples of measurement configurations that enable an increase of the amplitude and phase contrast of the images representing a structural defect in paramagnetic and ferromagnetic samples. Both examples involve an elimination of the excitation field component from the atomic magnetometer signal. First example is implemented with a set of coils that directly compensates excitation field in magnetometer signal. Second example takes advantage of the fact that the radio-frequency magnetometer is not sensitive to the magnetic field oscillating along one of its axis. Results of the modelling that confirm experimental observation are discussed in detail.

Reference is made to Bevington, Patrick & Gartman, Rafal & Chalupczak, Witold & Deans, Cameron & Marmugi, Luca & Renzoni, Ferruccio. (2018) "Non-Destructive Structural Imaging of Steelwork with Atomic Magnetometers" (Paper 1), which can be found at https://www.researchgate.net/publication/326060467 Non-Destructive Structural Imaging of Steelwork with for Magnetom eters, and the disclosure of which is incorporated herein by reference in its entirety.

Reference is also made to Bevington, Gartman & Chalupczak "Imaging of material defects with a radio-frequency atomic magnetometer" Review of Scientific Instruments 90, 013103 (2019); doi 10.1063/1.5053959 (Paper 2), a version of which was annexed as Annex 1 to UK patent application numbers GB1811928.9 and GB1813858.6 from which priority is claimed, and the disclosure of which is incorporated herein by reference in its entirety.

Paper 1 and Paper 2 provide context to the invention and any of the structural or method features, or applications, described in Paper 1 or Paper 2 are applicable to embodiments of the invention, by way of modification or addition.

Implementation of radio-frequency magnetic fields in non-destructive testing provides cost-effective options for detection of structural defects, particularly in cases when there is no direct access to the surface of the studied sample. The technique can involve monitoring the material response to the so-called primary magnetic field ($\vec{B}$) created by an rf coil [1]. The material response can be detected in a variety of ways. Traditionally this is achieved by monitoring the impedance of the rf coil (or a dedicated pickup coil) [1-5]. However, the simplicity of instrumentation in this type of measurement is outweighed by signal sensitivity degradation at low frequencies. Other options involve implementation of magnetic sensors such as giant magnetoresistance (GMR) magnetometers [6-8], superconducting quantum interference devices (SQUIDs) [9-10], and the radio-frequency magnetometers [11-14]. The magnetic field sensors directly monitor the response of the so-called secondary magnetic field (0 in the medium. The secondary field is produced by the primary magnetic field through eddy currents excited in highly conductive samples, or magnetisation induced in samples with high permeability [15], and contains signatures of the inhomogeneities/structural defects within the sample.

Embodiments of the present invention utilise rf atomic magnetometers and can be used for material defects imaging.

As described above embodiments of the present invention increase the amplitude and/or phase contrast of the output of the system.

In some embodiments, this is achieved by reducing the effect on the atomic magnetometer of components of the primary and secondary magnetic fields in a direction substantially orthogonal to the surface of a sample. This is described below in connection with two embodiments, both of which involve an elimination of the primary and secondary field components in a direction substantially orthogonal to the surface of the sample from the atomic magnetometer signal.

It is shown herein that the elimination of the primary field component from the magnetometer signal significantly increases the phase/amplitude contrast of the images. This can provide a relatively quick indication of a defect in non-destructive tests of large area samples. The concepts are explored in context of paramagnetic (aluminium) and ferromagnetic (carbon steel) samples.

Figure 1A:
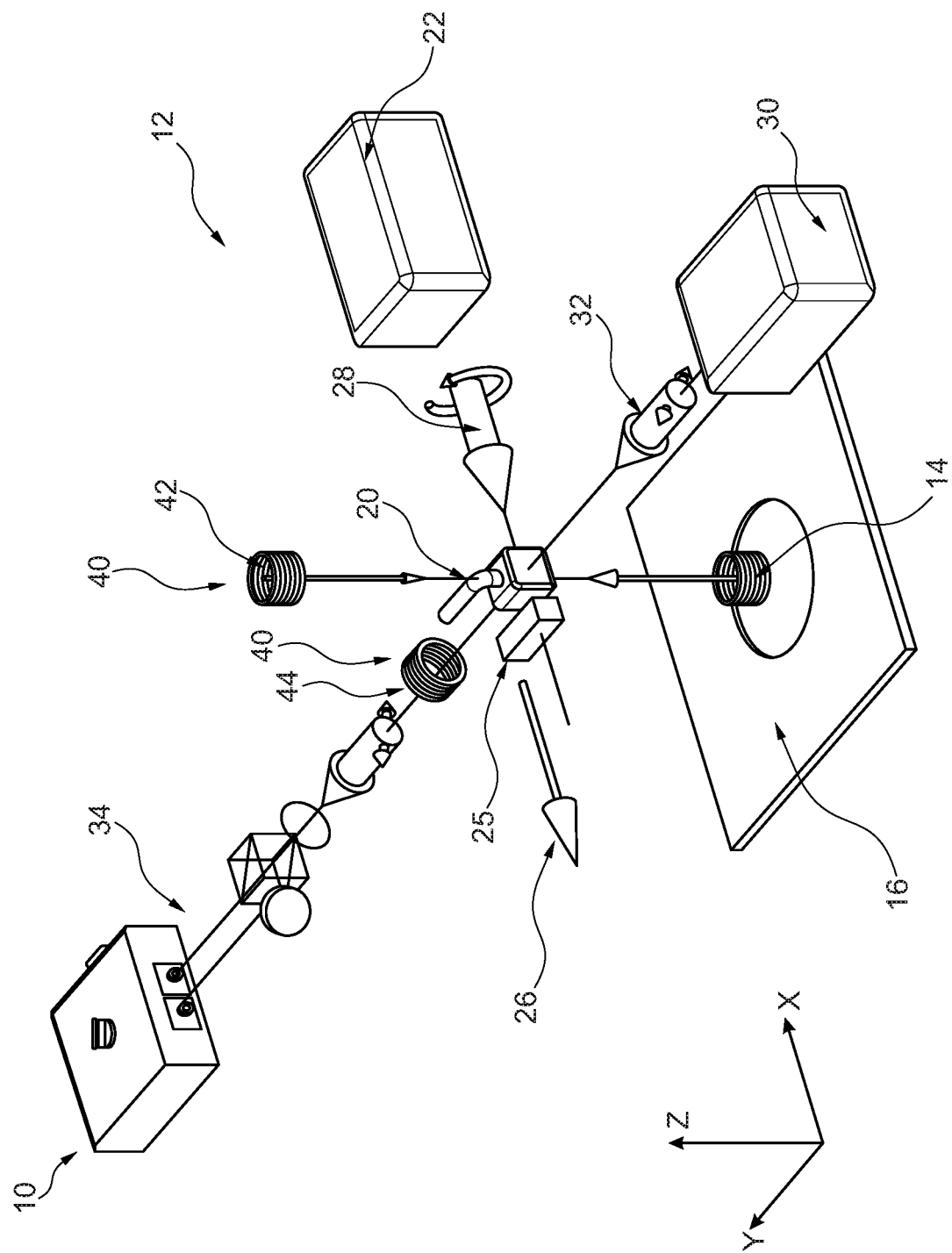
FIG. 1(a) shows a system for detecting a material response according to an embodiment of the invention.

As can be seen in FIG. 1(a), an embodiment of the invention includes a system 10 including a radio-frequency atomic magnetometer 12 and a primary magnetic field source 14 for providing a primary magnetic field oscillating at rf frequency. In this embodiment, the primary magnetic field source 14 is an rf coil; however, other magnetic field sources can be used in other embodiments.

In this embodiment, the rf coil 14 is a 1000 turn coil with 0.02 mm wire, wound on a 2 mm plastic core (inside diameter) and with a 4 mm width (outside diameter) and a 10 mm length.

Samples should be electrically conducting (although not necessarily highly electrically conductive) and/or should have a magnetic permeability such that they can be magnetised.

The rf coil 14 is configured so that it can be placed adjacent to a sample 16, but entirely on one side thereof and in a non-overlapping relationship therewith, and can be operated to generate an oscillating primary magnetic field to cause the sample to produce a secondary magnetic field. The secondary magnetic field is indicative of a material response of the sample. Reference is made to FIG. 1(c).

The atomic magnetometer is configured to detect the secondary magnetic field.

It is worth noting that ferromagnetic targets produce 2 types of secondary fields:
  a secondary magnetic field in the same direction as the applied primary field—the secondary magnetisation, and
  eddy current induced magnetic field in the opposite direction to the applied primary field—the eddy current induced magnetic field.

FIG. 1(a) shows the main components of an experimental setup. In this example, secondary magnetic field is produced by eddy currents excited in a sample (in this case an Al plate with recess having a 48 mm diameter and a 2.4 mm depth) by primary field created by the rf coil. Atomic magnetometer signal would normally combine components created by primary field generated by rf coil and secondary magnetic field.

In this description, the z direction is the direction orthogonal to the surface of the sample, and the x and y directions are mutually orthogonal directions that are parallel to the surface of the sample.

Details of the atomic magnetometer are described in W. Chalupczak, R. M. Godun, S. Pustelny, and W. Gawlik, Appl. Phys. Lett. 100, 242401 (2012), which is incorporated herein by reference in its entirety. Since the experimental setup is similar to that described in [17,15] only some components will be briefly discussed here.

The atomic magnetometer 12 includes a detection cell 20, which in this embodiment is a 1 $cm^3$ paraffin coated glass cell containing room temperature cesium atomic vapour (for which atomic density $n_{Cs}=3.3\times10^{10}$ $cm^{-3}$).

The magnetometer includes a bias magnetic field source 24 (not shown in FIG. 1(a)) configured to provide a bias magnetic field 26 at the detection cell 20 in a bias magnetic field direction.

To perform active compensation of the ambient field and any residual DC magnetic field created by the sample, the magnetometer includes a fluxgate 25 located next to the vapour cell 20 and three PID units (in this embodiment SRS 960). In this embodiment, the fluxgate is Bartington Mag690. With passive and active compensation of the ambient field, the linewidth of the rf spectral profile is approximately 30 Hz. The small size of the detection cell 20 can provide partial immunity to ambient field gradients.

The magnetometer includes a pump laser 22 configured to pump the atoms in the detection cell 20 with a circularly polarised pump laser beam 28, in this embodiment at 377 µW, frequency locked to the cesium 6 $^2S_{1/2}$ F=3→6 $^2P_{3/2}$ F'=2 transition (D2 line, 852 nm) propagating along the bias magnetic field 26.

The atomic magnetometer includes a probe laser 30 configured to probe atomic spin precession in the detection cell 20 with a linearly polarised probe laser beam 32 phase-offset-locked to the pump beam and orthogonal to the bias magnetic field 26.

The atomic magnetometer includes a balanced polarimeter 34 configured to receive the probe laser beam after passing through the detection cell 20 and detect Faraday rotation. The balanced polarimeter is configured to provide an electronic output signal representing the Faraday rotation detection.

The rf coil 14 axis is orthogonal to both the pump and probe beam.

The system 10 includes a primary field oscillation controller in the form of a lock-in amplifier 36 (not shown in FIG. 1(a)) configured to operate the rf coil 14 by providing current therein oscillating at an rf frequency to generate the primary magnetic field and to control the frequency and phase of the current in the rf coil 14 and thereby also of the primary magnetic field, and includes a receiver to receive the output signal from the balanced polarimeter of the atomic magnetometer. The lock-in amplifier 36 may be configured to provide frequency modulated current in the rf coil to provide a frequency modulated primary magnetic field, although this is not necessary in every embodiment. The lock-in amplifier is configured to demodulate the output signal from the balanced polarimeter with reference to the current frequency or modulation of the rf coil 14, and to provide a first output signal for example to a computer to obtain an amplitude and/or phase of the signal. The lock-in amplifier thereby serves as a demodulator. The computer can use the amplitude of the signal to detect a material response of the sample, and in some cases to perform material defects imaging.

In some embodiments, the computer can include a receiver to receive the first output signal from the lock-in amplifier 36 and to determine therefrom changes in conductivity and/or permeability of the sample.

This embodiment uses a magnetically unshielded environment where static fields along y and z directions are nulled and a bias field along the x direction is created by three pairs of mutually orthogonal nested square Helmholtz coils [18] with dimensions 1 m, 0.94 m and 0.88 m respectively (largest coil length 1 m) The Helmholtz coils form a coil arrangement for active and passive compensation of the ambient magnetic field, for lowering noises, and for stabilising and adjusting the direction and strength of the bias magnetic field. In other words, the coil arrangement provides the bias magnetic field source.

Figure 1B:
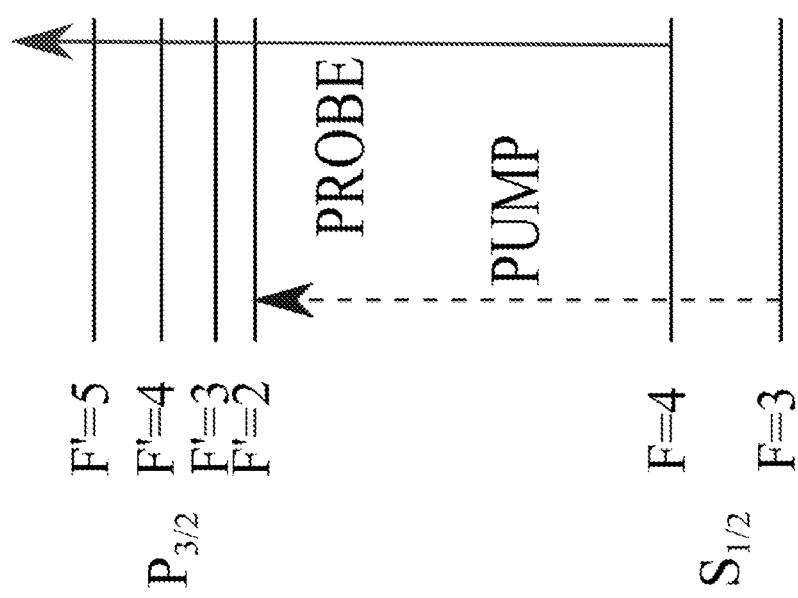
FIG. 1(b) shows a Caesium transition.
Figure 1C:
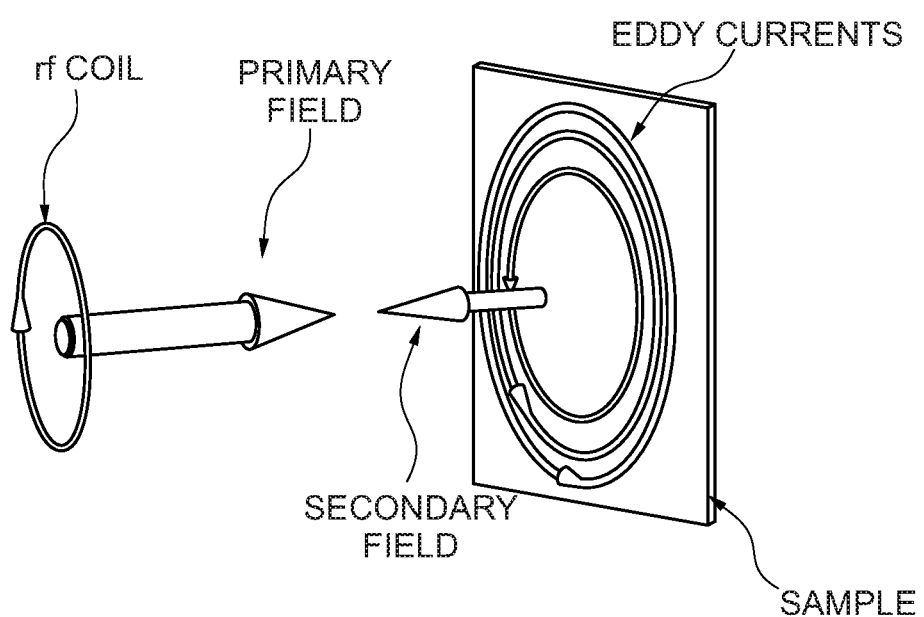
FIG. 1(c) shows how secondary magnetic fields are formed in some instances.

The measurement signal comes from the phase and amplitude change in the rf resonance spectra registered by the rf atomic magnetometer as a sample is moved under the rf coil (FIG. 1(*a*)). The rf coil producing $\vec{B}$ is driven by the output of the internal reference of the lock-in amplifier 36.

In the experimental set-up shown and described, the samples are fixed to a 2D, computer controlled translation stage. The sample 16 is located approximately 30 cm from the cell and the coil is placed 1 mm-2 mm above the sample surface on the same axis as the cell.

The strength of the bias field ($\vec{B}_{btas}$) defines the operating frequency of the system (12.6 kHz in this embodiment, although other frequencies can be used, for example in the range 10 kHz-20 kHz), in other words the frequency of the magnetic resonance and the required primary field frequency.

In operation, coherent atomic spin precession is driven by the rf field. The superposition of the primary and the secondary fields alters this motion, which is probed with the linearly polarized probe laser beam 32 propagating orthogonally to the bias magnetic field 26. Cs atoms are optically pumped into the stretched state (F=4, $m_F$=4) with the circularly polarised pump laser 22 locked to the Cs 6 $^2S_{1/2}$ F=3→6 $^2P_{3/2}$ F'=2 transition (D2 line, 852 nm) propagating along the bias magnetic field $\vec{B}_{bias}$The probe beam (30 μW) is phase-offset-locked to the pump beam, bringing it 580 MHz blue shifted from the 6 $^2S_{1/2}$ F=4→6 $^2P_{3/2}$ F'=5 transition (D2 line, 852 nm). Coherent spin precession of the Cs atoms is coupled to the polarisation of the probe beam (Faraday rotation) which is detected with the balanced polarimeter, whose signal is then processed by the lock-in amplifier 36 referenced to the phase of the rf field.

For imaging, this can be performed for each pixel of the sample surface, as the sample or system is moved.

The skilled person will appreciate that the particular atomic magnetometer described above is not the only type of atomic magnetometer that can be used; for example, different detection cells, different dimensions, different powers, different laser frequencies, and different transitions can be employed as appropriate. In particular, atoms other than Cs atoms can be used in solid state, liquid, and/or vapour form, and the frequencies and powers can be adjusted accordingly.

Furthermore, the means of pumping, field generation, translation and probe beam detection can be varied. For example, the pump and probe subsystem can use one, two, three, or more lasers to perform the pumping and probing, and the polarisations of the beams can be varied in some embodiments. The balanced polarimeter can be replaced with any probe beam detector which is preferably a photodetector that can detect the polarisation and/or amplitude of the probe beam.

The inventors have previously analysed the shape of the spatial profiles generated by the recess in aluminium plates [15]. The profile represents variations in phase and amplitude of the rf spectroscopy signal recorded by the atomic magnetometer. It contains contributions from the primary and secondary magnetic field. A strong primary field contribution in the magnetometer signal results in the mapping of two orthogonal components of the secondary field, $b_z$ and $b_y$, onto the amplitude and phase of the rf spectroscopy signal respectively. The inventors have noted that the component of the secondary field, $b_y$, parallel to the sample surface changes its sign in the vicinity of the surface crack (recess). As a consequence of a strong primary field, variations in the resultant field recorded by the rf atomic magnetometer measure the direction flip of the secondary field component, however the observed rf signal phase change is smaller than actual change in $b_y$.

Referring again to FIG. 1(*a*), in this embodiment of the invention, the system includes a compensatory magnetic field source 40 for providing an oscillating compensatory magnetic field, also called a compensation magnetic field, at the atomic magnetometer, specifically at the detection cell 20, including a component substantially orthogonal to the surface of the sample 16 reducing and preferably eliminating the effect on the atomic magnetometer of magnetic field components of the primary and secondary fields in that direction. In particular, the compensatory magnetic field compensates the primary field contribution to the resultant field monitored by the atomic magnetometer vapour cell, without changing efficiency of b excitation.

As can be seen from FIG. 1(*a*), in this embodiment the compensatory magnetic field source 40 is a compensation coil arrangement including a first compensation coil 42 and a second compensation coil 44.

The first compensation coil 42 has an axis substantially aligned with z, a direction orthogonal to the surface of the sample 16 so as to provide a magnetic field at the atomic magnetometer, specifically at the detection cell 20, which is substantially orthogonal to the surface of the sample 16.

In this embodiment, the detection cell 20 is located between the rf coil 14 and the first compensation coil 42, although this is not necessary in all embodiments.

The second compensation coil 44 has an axis substantially aligned with y, a direction parallel to the surface of the sample 16 and substantially orthogonal to the bias field direction so as to provide a magnetic field at the atomic magnetometer, specifically at the detection cell 20 which is substantially parallel to the surface of the sample 16 and substantially orthogonal to the bias field direction.

In this embodiment, the detection cell 20 is located between the probe laser 30 and the second compensation coil 44, and the second compensation coil 44 is located between the detection cell 20 and the balanced polarimeter 34, although this is not necessary in all embodiments.

The compensatory coil arrangement 40 is configured to provide, at the detection cell 20, a compensatory magnetic field $\vec{B}_C$.

In other words, a set of two rf coils oriented along z and y directions (FIG. 1(a)) creates an oscillating magnetic field, $\vec{B}_C$, that compensates the primary field seen by the atomic magnetometer. The coils are driven by the output of the internal reference of the same lock-in amplifier 36 used to generate B. This keeps a constant phase difference between the fields $\vec{B}$ and $\vec{B}_C$.

In other words, the primary field is compensated in vapour cell by a set of two rf coils oriented along z and y direction.

However, for reasons explained below, the component of the secondary magnetic field in the z direction is also compensated.

The amplitudes of the two components of $B_c$ can be varied by changing the distance of the relevant coils from the vapour cell.

The resultant magnetic field monitored by the rf atomic magnetometer includes components from the primary, secondary and compensation field, in other words $\vec{b}+\vec{B}+\vec{B}_c = \vec{b}+\vec{B}'$.

The configuration allows determination of amplitude and phase (orientation) of the rf in yz plane. The amplitude ($R=\sqrt{(b_y+\text{8'}_y)^2+(b_z+B'_z)^2}$) and the phase $$\left(\varphi = \arctan\left(\frac{b_y + B'_y}{b_Z + B'_Z}\right)\right)$$

of the rf spectroscopy signal describes changes in the resultant field, where $b_z+B'_z$ and $b_y+\text{8'}_y$ are the two quadrature components of the rf signal.

Figure 2:
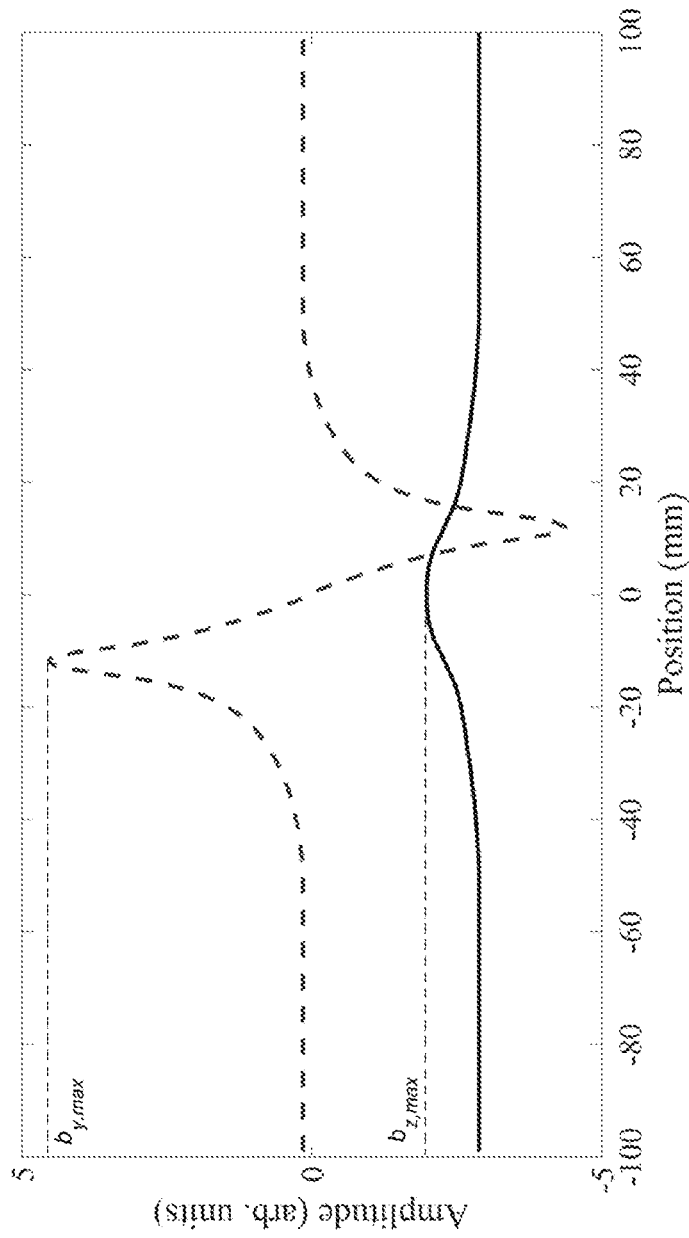
FIG. 2 shows a simulation of the secondary field components $b_y$ and $b_z$ (marked with dashed red and solid blue lines respectively) as the coil is moved along the y axis through the centre of the recess in the embodiment of FIG. 1. Maximum values of $b_y$ and $b_z$ within the recess boundaries are referred to as $b_{y,max}$ and $b_{z,max}$.

We begin with a model of b in the case of a 1D scan of the rf coil position in ŷ direction across the centre of the recess (FIG. 1(a)) in conductive samples (the skilled person will appreciate that a similar argument, as below, could be done based on magnetisation for samples with a magnetic permeability). In this geometry only $b_y$ and $b_z$ components are produced. FIG. 2 shows the dependence of the secondary rf field components on rf coil position. In a homogeneous sample eddy current flow has circular symmetry and b has only one non-zero component, $b_z$ [solid blue line in FIG. 2]. In vicinity of the recess, the symmetry of eddy currents flow is broken and non-zero component b is produced in the yz plane [dashed red line in FIG. 2]. The asymmetry of eddy current flow is mirrored on the other side of the recess, which results in the opposite sign of $b_y$. In the case of an rf coil above the recess, due to bigger lift off magnetic field flux through the plate becomes smaller, and consequently |$\vec{b}$| decreases. We will refer to the maximum value of by, and $b_z$ within the recess boundaries as by,max, and bz,max.

As we have shown previously [15], in the presence of a strong primary field $\vec{B}$ along z, changes in the secondary field components are mapped onto the amplitude ($b_z$) and phase ($b_y$) of the rf spectroscopy signal. Changes in the resultant magnetic field monitored by the atomic magnetometer are relatively small as they appear on top of a much bigger primary field.

To provide better insight, we consider the case where $$|\vec{b}| \sim \frac{1}{3}|\vec{B}|$$

along both z and ŷ. Here, the observed amplitude and phase contrasts are estimated to be $C_R \leq 0.05$ and $C_\varphi \leq °$ respectively, where $C_R=(R_{Max}-R_{Min}/R_{Max}+R_{Min})$ and $C_\varphi \leq 4°$ $R_{max}, R_{min}$, $\varphi_{max}$, and $\varphi_{min}$ being max/min values of relevant variables (see corner graphs in FIG. 3(c)). These values are significantly lower than their maximum of $C_R=1$ and $C_\varphi=180°$.

FIG. 3 shows the simulated dependence of the amplitude and phase of the rf spectroscopy signal measured by the atomic magnetometer on the resultant magnetic field. Complete compensation of the primary field component in the resultant magnetic field monitored by the atomic magnetometer (|B'|~0) leads to an increase in amplitude and phase contrast [$C_R=0.44$ and $C_\varphi=124°$, central plot in FIG. 3] but does not produce maximum contrast values. The reason being that for |$\vec{B}'$|=0 the signal amplitude becomes $R=\sqrt{b_y^2+b_z^2}$, where the high contrast component $b_y$ is reduced by the slowly varying offset of $b_z$ (FIG. 2).

The phase of the rf spectroscopy signal $$\left(\varphi = \arctan\left(\frac{b_y + B'_y}{b_Z + B'_Z}\right)\right)$$

changes by 180° only when there is a change of the sign in the nominator and a singularity in the denominator. This indicates that the condition for achieving maximum contrast, with respect to the ẑ axis components, is when $B'_z+b_{z,max}=0$. In the following, we refer to this condition, along with $B'_y=0$, as the compensation point. FIG. 3 confirms that the maximum amplitude and phase contrast is observed for $B'_z+b_{z,max}=0$, in each column, i.e. for an arbitrary value of $B'_y$.

Moving right/left from the compensation point amounts to the addition of a negative/positive reference level. This induces a symmetry change of the profiles observed on either side of the compensation point. The amplitude and phase contrasts ($C_R=1$, $C_\varphi=180°$) do not deteriorate in the vicinity of the compensation point as long as |$B'_y$|≤$b_{y,max}$. In the vicinity of the compensation point, modelling predicts phase jumps in the magnetic resonance signal by nearly 180° over the recess area. The reason for the sudden phase change is the presence of a z component in the resultant rf field in the denominator of the arctan function that defines the phase of rf spectroscopy signal.

The inventors adapted as a testbed for the experimental exploration of rf magnetic field compensation, changes in the amplitude and phase of the rf spectroscopy signal recorded with an rf coil scanned across a defect in the form of a recess (24.5 mm diameter, 2.4 mm deep) in 6 mm thick aluminium and carbon steel plate [15]. We begin from the realization of the compensation point. Experimentally, this is achieved by tuning the distance between the compensation coils and the vapour cell 20 (FIG. 1(a)). The coil located above the vapour cell 20 (the first compensation coil 42) is positioned on axes with the rf coil 14 producing the primary field. The optimum location of this coil along z is established by minimising the amplitude of the rf spectroscopy signal. The position of the other compensation coil (the second compensation coil 44) can be adjusted in all three directions. The presence of this coil is particularly important in measurements with ferromagnetic objects, where a significant rf field is produced in the plane parallel to the sample surface (the horizontal plane in this instance) by the sample. FIG. 3 indicates that compensation in the horizontal direction results in symmetric amplitude and phase profiles. This factor is utilised in searches for the compensation point.

FIG. 4 shows the changes in (a) amplitude, $C_R$ (blue diamonds), and (b) phase, $C_\varphi$, contrast as a function of the distance of the vertical coil from the compensation point along z. The measurement has been performed with a 6 mm thick aluminium plate. Green squares in FIG. 4(a) represent the change of the rf spectroscopy signal measured in the centre of the recess. Both plots confirm the presence of the maximum contrast at the compensation point. For reference, we show the amplitude/phase contrast value recorded without rf compensation fields [blue/red solid line in FIG. 4(a)/(b)].

FIG. 5(a)-(c)/(g)-(i) shows the amplitude/phase images of 64×64 mm$^2$ area of a 6 mm thick carbon steel plate containing a 24.5 mm diameter recess that is 2.4 mm deep recorded for three values of the horizontal component of the compensation rf field. The vertical cross-sections through the centre of the amplitude/phase images are shown in FIG. 5(d)-(f)/(j)-(l). They are equivalent to the calculated amplitude profiles from the second row of FIG. 3. The cases illustrated in FIG. 5(b)/(e), ((h)/(k) represent the compensation point. Near the compensation point, the amplitude image produced by a recess is symmetrical, i.e. two maxima corresponding to rising and falling edges. This results from zeroing the primary field that sets the background reference for changes in the secondary field generated by the magnetisation (R~|b$_y$|). The bright maximum in FIG. 5(b) is surrounded by a dark ring, in other words, the profiles created by the two recess edges are not perfectly symmetrical. This might be due to imperfect compensation of the static magnetic field, in addition to the rf fields. Imperfect compensation of the static magnetic field, i.e. a variation of the ambient magnetic field, is equivalent to a change in the direction of the atomic magnetometer axis, which could affect the observed image [see following section, FIGS. 7(b) and (c)]. This could be minimised by increasing the operating frequency. The magnetic response of the sample can be thought of in terms of changes in the rf coil inductance. Inhomogeneity in the magnetisation across the plate would be seen as a variation of the primary field strength, meaning rf field compensation is valid only locally. Change of the rf field strength monitored by the magnetometer can be seen by the variation in the background level. There is a change in the shape and symmetry of the amplitude profiles on either side of the compensation point, related to the passage from R=|b$_y$+B'$_y$| [FIG. 5(d)] through R~|b$_y$| [[FIG. 5(e)]] to R=|b$_y$− B'$_y$| [FIG. 5(f)]. The phase contrast decreases as we move away from the compensation point, FIG. 5(g)-(i). Importantly, the area where the phase departs from its background value decreases away from the compensation point. This might have practical consequences in a measurement with a coarse spatial step, since the phase change generated by the recess could be non-visible as it would be equivalent to spatial integration of the phase change over a larger area.

The benefit of rf compensation can be demonstrated in the experiment with increased lift-off distance, 6 mm-7 mm. Starting point for this is a measurement of the phase contrast in a standard configuration (the rf coil producing the primary field located 1 mm-2 mm above the sample surface, no rf compensation). The phase contrast for a case of a 12 mm diameter recess that is 2.4 mm deep in 6 mm thick aluminium plate is $C_\varphi$=40°. An increase of the lift off (6 mm-7 mm) results in a reduction of the strength of the primary at the sample, and consequently, secondary field. At the same time, for a fixed distance between the vapour cell and the sample, FIG. 1(a), the primary field component monitored by the atomic magnetometer increases. This causes a reduction of the recorded phase contrast to $C_\varphi$=20°. With the adjustments of the compensation rf field we were able not only to recover the initial phase contrast value but even increase it to its maximum value, $C_\varphi$=180°.

Although in the embodiment above, $\vec{B}_c$ has components in direction y as well as z, this is not necessary in every embodiment. For example, it is possible to compensate only in the z direction. In the above embodiment, this means that the second compensation coil 44 can be omitted.

Another embodiment is shown in FIG. 6. In the embodiment of FIG. 6, the effect on the atomic magnetometer of components of the primary and secondary fields in a direction substantially orthogonal to the surface of the sample is reduced by aligning an insensitive axis of the atomic magnetometer with a direction substantially orthogonal to the surface of the sample.

The method of this embodiment benefits from fact that the rf atomic magnetometer is not sensitive to magnetic field oscillating along static bias field axes, $\vec{B}_{bias}$(FIG. 1(a)) [16]. For the $\vec{B}_{bias}$ oriented along z, which is preferably also the $\vec{B}$ direction, $B_z$ will be absent in the rf atomic magnetometer signal and the measurement configuration becomes equivalent to one with the compensated primary field component.

The atomic magnetometer evaluates the oscillating magnetic field strength through measurement of the atomic Zeeman coherence amplitude produced by this field in the atomic vapour polarized along direction of the static magnetic field, $\vec{B}_{bias}$ [19]. Since only magnetic fields oscillating orthogonally to $\vec{B}_{bias}$ direction can generate atomic coherences, magnetometer is insensitive to the rf fields along $\vec{B}_{bias}$ direction. For the $B_{bias}$ aligned along z, this property of the atomic magnetometer is equivalent to first part of the compensation condition, $B'_z+b_z=0$, in other words an absence of the z-component of the resultant rf field in the magnetometer signal.

The embodiment of FIG. 6 is in many respects the same as the embodiment of FIG. 1(a) except as discussed. Static bias magnetic field 26 is directed along z and set to the same strength used in previous measurements (equivalent to Larmor frequency about 12.6 kHz). The pump laser beam 28 is aligned along bias magnetic field 26. The Helmholtz coils are adjusted accordingly and configured to null static fields along x and y directions.

Although not necessary in all embodiments, in the embodiment of FIG. 6, the system also includes a set of rf coils 40' for providing a compensatory magnetic field for compensating for components of the primary field which are parallel to the sample surface (horizontal components of the primary field in this instance). The position of these compensating coils are varied such that the rf spectroscopy signal is minimised. The compensating coils 40' include a first compensation coil 46 and the second compensation coil 44, the second compensation coil 44 being as discussed above. The first compensation coil 46 has an axis substantially parallel to the sample surface and substantially orthogonal to the bias field direction and the direction of the probe laser. In this embodiment, the axis of the first compensation coil 46 is substantially aligned with direction x. The current though the compensation coils 40' is adjusted to minimize the rf spectroscopy signal without sample, in other words to compensate horizontal components of the primary field (B'$_x$=0 and B'$_y$=0). As before, the resultant magnetic field monitored by the rf atomic magnetometer includes components from the primary, secondary and compensation field, in other words $\vec{b}+\vec{B}+\vec{B_c}=\vec{b}+\vec{B'}$.

In the embodiment of FIG. 6, the amplitude ($R=\sqrt{(b_x)^2+(b_y)^2}$) and the phase $$\left(\varphi = \arctan\left(\frac{b_x}{b_y}\right)\right)$$

of the rf spectroscopy signal reflect variations of the amplitude and phase of the horizontal components of the secondary field.

In other words, the embodiment of FIG. 6 has $\vec{B_{bias}}$ along z. The pump laser beams orients atomic vapour along direction of the bias field. Horizontal components of the primary field is compensated in vapour cell by a set of two rf coils oriented along x and y direction.

FIG. 7 illustrates benefits of and differences between two discussed compensation schemes. It shows the images of 64×64 mm² area of a 6 mm thick AI plate containing a 24 mm diameter recess that is 2.4 mm deep recorded in three different configurations: (a) without compensation, (b) with compensation performed with two rf coils, and (c) with rotated bias magnetic field and compensation coils. Images represent the change of the amplitude of the rf spectroscopy signal. As mentioned before, for the uncompensated case (a) the recorded profile shows variation of the vertical component of the secondary field. In compensated cases the images show horizontal component (b)/components (c) of the secondary field. The difference in symmetry of the image results from the change of the direction of the bias field. In case shown in FIG. 7(b) $\vec{B_{bias}}$ is directed along x axis and therefore only signatures produced by the recess edges parallel to that direction are present in the recorded profile (in other words, the edge parallel to $\vec{B_{bias}}$ produces oscillating secondary field perpendicular to $B_{bias}$ that could be seen by the magnetometer). In case shown in FIG. 7(c) $\vec{B_{bias}}$ directed along z axis and the recorded profile shows whole contour of the recess. We have calculated the amplitude contrast, $C_R$, as defined previously for the three images. The numbers confirm [(a) $C_R$=0.04; (b) $C_R$=0.77; (c) $C_R$=0.79] that implementation of the compensation schemes allows easier identification of the structural defects in the amplitude images. In case of the modified geometry, the phase of the rf spectroscopy signal shows a vortex centered on the recess.

Demonstrated above are two methods for improvement of the contrast in the images representing the variations of the amplitude and phase of the rf spectroscopy signal recorded by the atomic magnetometer in eddy currents NDT measurement. The methods are based on compensation of the components of the resultant rf magnetic field monitored by the atomic magnetometer implemented in the above examples by either a set of coils or the geometry of the measurement. Reduction of the amplitude of the rf signal monitored by the atomic magnetometer through compensation process does not compromise ability for a defect detection. On contrary, monitoring of the signal phase in compensated configuration provides with the option of clear (180° phase change) signature of the inhomogeneity.

In another embodiment for increasing the amplitude and/or phase contrast of the output of the system, the bias magnetic field is modulated. This can be in addition to or instead of reducing the effect on the magnetometer of components of the primary and secondary magnetic fields in a direction substantially orthogonal to the sample. In other respects, the embodiment is substantially as described for the first or second embodiments.

FIG. 8 shows a schematic system diagram of the system of FIGS. 1(a) and 6. The system works in the following way.

1. Output of the internal reference of the lock-in amplifier (1) 36 generates frequency modulated current in the rf coil 14.
2. The coil 14 produces (primary) rf field, which drives precession of atomic spins in the detection cell in the bias magnetic field ($B_{Bias}$).
3. Bias magnetic field strength defines the value of resonant Larmor frequency ($\omega_L=\gamma B_{Bias}$), the frequency for which there is a maximum coupling between atomic spins and rf field.
4. To observe the precession of the atomic spins, off-resonant linearly polarised probe beam 32 is used. Beam polarisation direction is coupled to the atomic spins oscillation via Faraday's effect. The polarisation oscillation is transferred to electronic signal by balanced polarimeter 34. Amplitude and phase of the oscillation is read by lock-in amplifier 36 (referenced to the rf coil current modulation).
5. To see resonant behaviour of atomic spins precession we can either scan the primary field frequency for given bias magnetic field (left plot of FIG. 9) or scan bias magnetic field for the chosen primary field frequency (right plot of FIG. 9). FIG. 9 shows how results would look like in both examples.
6. When the sample is placed in the vicinity of the rf coil, the atoms will additionally experience influence of the secondary field produced by a sample.

Phase and Amplitude of the Signal

When the sample is moved in vicinity of the rf coil, interference between primary and the secondary field causes change of amplitude and direction of the rf field driving the atoms. Change of rf amplitude transfers to change of strength of atomic response, whereas change of direction of rf field transfers to the change of the phase of atomic spin oscillation.

Single Pixel on the Scan

In the simplest and the fastest measurement scheme we could set rf field frequency to be on resonance and measure amplitude and phase of atomic signal while the sample is being moved. The inventors have done this with aluminium which is non-magnetic but steel samples are ferromagnetic and are strongly magnetised. This causes shifts of bias magnetic field and even with the active field compensation such as described above, the shift is typically bigger than the linewidth of the resonance. The shift is a consequence of nonzero distance between magnetic probe used for field compensation and the atomic cell.

One way to eliminate this problem is shown in FIG. 10; however, this involves a slow measurement (time: 10 s per pixel). This method is as follows:

1) Rf field frequency is scanned by scanning the current modulation frequency of rf coil 14.
2) Signal is demodulated by lock-in 1 and changes of the in-phase and the quadrature component of the signal are recorded.
3) Computer fits the data and from the fit amplitude and phase of the signal is extracted.

However, in an embodiment of the invention, an improved way to eliminate this problem is shown schematically in FIG. 11, which provides fast measurement (<1 s per pixel).

As described above, in most measurements, the frequency of the primary field is scanned across rf resonance, i.e. the whole resonance profile is recorded, for each point of the image [15]. The inventors have developed another mode of data acquisition, which enables significant decrease in image acquisition time. In this mode, the modulation of the $\vec{B}$ frequency is replaced with the low-frequency modulation (1-20 Hz in this example) of the amplitude of the $\vec{B}_{bias}$ component. In this case, the signal demodulated at the primary field frequency by the lock-in amplifier 36 (SRS 865 in this embodiment) contains low-frequency oscillation with the amplitude equal to this of the rf resonance amplitude. The use of second lock-in amplifier referenced to the frequency of the $\vec{B}_{bias}$ amplitude modulation enables readout of the rf resonance amplitude. The extent of the $\vec{B}$ frequency modulation can balance an imperfection in the $B_{bias}$ stabilizations such as a possible shift in resonance frequency for different sample locations. As a consequence of that the phase of the recorded signal contains information about the change of the secondary field as well the rf profile frequency shift.

In this embodiment, the system includes the second lock-in amplifier 38.

The bias magnetic field source 24 includes a modulator to modulate the bias magnetic field and to output a modulation signal to the second lock-in amplifier 38. The first output of the first lock-in amplifier (referenced to rf coil frequency) is connected to the input of the second lock-in amplifier (referenced to the bias field modulation). The second lock-in amplifier is configured to demodulate the output signal from the first lock-in amplifier 36 with reference to the modulation of the bias magnetic field and to provide an amplitude and phase of the signal. The second lock-in amplifier 38 thereby serves as a demodulator.

The method is as follows:
1) Frequency of the rf field is kept constant but the value of the bias magnetic field is slowly modulated. In this embodiment the frequency of bias field modulation is 1-10 Hz (precession frequency is around 12 kHz). However, it is preferable for the frequency of the bias field modulation to be as high as possible. This bias field modulation is preferably in the form of a sawtooth wave which periodically ramps the bias field either up or down.
2) In this case we observe amplitude modulated signal.
3) We measure amplitude of this oscillations with the first lock-in (we demodulate with reference to the primary field frequency).
4) Measurement of the amplitude of slow modulation is performed with the second lock-in referenced to the signal of bias magnetic field modulation. Amplitude measured by Lock-in 2 corresponds to the amplitude of atomic resonance.

Embodiments, for example such as any of the systems described above, can perform imaging with a sensitivity of 0.1 mm.

Embodiments can be used to image steelwork non-destructively in the presence of concealing conductive barriers at room temperature, in magnetically unscreened environments, with active compensation of the background fields, and compensation of the samples' magnetisation.

This can be used for example for detection of corrosion in concealed pipes (CUI) and detection of structural anomalies in concrete structures.

Embodiments of the invention can be used for detecting corrosion under insulation. Embodiments of the invention can provide increased contrast to enable the imaging of sub-mm corrosion pits for example in pipes.

In some embodiments, the systems described above can be deployed on a robot to scan large areas for example of pipeline.

In some embodiments, the method and/or system can be used for detection of the condition of concrete structures.

Applications can be in manufacturing and construction, where quality of assemblies and welding is important, and often requires the use of potentially dangerous and expensive X-ray scans; materials manufacturing as part of a fabrication process; health and usage monitoring systems (HUMS), where timely and non-invasive identification of structural damages and fatigue is a primary target; nuclear; and in the utilities and/or energy sector, for example oil and gas, where spillage has economical as well as environmental costs. Applications also include detecting corrosion under insulation for energy sector, monitoring of the re-enforced concrete structures for transport sector, nuclear waste vessels monitoring.

Particular advantages are that the system and method may:
Be safe and non-invasive (e.g. non-ionising radiations)
Detect corrosion on the inner-wall of a pipeline.
Detect corrosion on the outer-wall of a pipeline.
Be able to differentiate between corrosion and changes to pipeline geometries from bends/T-Junctions/welds in the pipe.
Be able to scan through all insulation types.
Be low cost.
Provide improvements to current techniques (resolution, switch scanning-modes).

Although in the embodiments above, a lock-in amplifier 36 is described as providing the primary field controller, the primary field controller can include any current generator provided that the primary field oscillation controller includes a processor for demodulating the output signal from the balanced polarimeter with reference to the frequency or modulation of the current generator. Nevertheless, a lock-in amplifier is advantageous because they make the detection of the spectra easier as the source of the frequency/modulation and detector are inside one instrument (synchronisation, referencing, is automatically sorted out).

Although in the embodiments above, the material response detection is used for material defects imaging, this is not necessary in every embodiment. In some embodiments, the material response detection can be used for other purposes, for example to detect material conductivity and/or permeability.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

Further details can be found in "Enhanced material defect imaging with a radio-frequency atomic magnetometer" J. Appl. Phys. 125, 094503 (2019); doi: 10.1063/1.5083039, a version of which was annexed as Annex 2 to UK patent application numbers GB1811928.9 and GB1813858.6 from which priority is claimed, and the disclosure of which is incorporated herein by reference in its entirety.

The disclosures in UK patent application numbers GB1811928.9 and GB1813858.6 from which priority is claimed, and in the abstract accompanying this application, are incorporated by reference in their entirety.

REFERENCES

[1] L. Ma and M. Soleimani, Meas. Sci. Technol., 28, 072001 (2017).
[2] H. Griffiths, Meas. Sci. Technol., 12, 1126 (2001).
[3] B. A. Auld and J. C. Moulder, J. Nondestr. Eval. 18, 3 (1999).
[4] L. Perez, J. Le Hir, C. Dolabdjian, and L. Butin, J. Elec. Eng., 55, 73 (2004).
[5] A. Sophian, G. Tian, M. Fan, Chin. J. Mech. Eng., 30, 500 (2017).
[6] T. Dogaru and S. T. Smith, Nondestr. Test. Eval., 16, 31 (2000).
[7] T. Dogaru and S. T. Smith, IEEE Transactions on Magnetics, 37, 5, 3831 (2001).
[8] P. Ripka, M. Janosek, IEEE Sensors J. 10, 1108 (2010).
[9] H. J. Krause and M. V. Kreutzbruck, Physica C, 368, 70 (2002). J. Storm, P. Hömmen, D. Drung, R. Körber, App. Phys. Lett. 110
[11] A. Wickenbrock, S. Jurgilas, A. Dow, L. Marmugi, and F. Renzoni, Opt. Lett. 39, 6367 (2014).
[12] C. Deans, L. Marmugi, S. Hussain, and F. Renzoni, Appl. Phys. Lett. 108, 103503 (2016).
[13] A. Wickenbrock, N. Leefer, J. W. Blanchard, and D. Budker, Appl. Phys. Lett. 108, 183507 (2016).
[14] C. Deans, L. Marmugi, and F. Renzoni, Opt. Exp. 25, 17911 (2017).
[15] P. Bevington, R. Gartman, W. Chalupczak, C. Deans, L. Marmugi, and F. Renzoni submited to App. Phys. Lett.
[16] Orientation of the GMR sensitive axis paralel to the surface of the sample has been discussed in [7].
[17] W. Chalupczak, R. M. Godun, S. Pustelny, and W. Gawlik, Appl. Phys. Lett. 100, 242401 (2012).
[18] G. Bevilacqua, V. Biancalana, P. Chesssa, Y. Dancheva, App. Phys. B 122 103 (2016).
[19] W. Chalupczak, R. M. Godun, S. Pustelny, Advances in At. Mol. and Opt. Phys. 67, 297 (2018).

The invention claimed is:

1. A method of detecting a material response, including:
providing an oscillating primary magnetic field to cause a sample to produce a secondary magnetic field;
reducing the effect on an atomic magnetometer of components of the primary and secondary magnetic fields in a direction substantially orthogonal to a surface of the sample;
detecting the secondary magnetic field with the atomic magnetometer to detect the material response; and
wherein reducing the effect on an atomic magnetometer of components of the primary and secondary magnetic fields in a direction substantially orthogonal to a surface of a sample includes:
providing a compensatory magnetic field at the atomic magnetometer including a component substantially orthogonal to the surface of the sample.

2. The method of claim 1, wherein the compensatory magnetic field is provided such that Bz'+bz=0, wherein Bz' is a component of $\vec{B'}$ which is substantially orthogonal to the surface of the sample, bz is a component of the secondary magnetic field which is substantially orthogonal to the surface of the sample, $\vec{B'}=\vec{B}+\vec{B_C}$, $\vec{B}$ is the primary magnetic field, and $\vec{B_C}$ is the compensatory magnetic field.

3. The method of claim 1, wherein the compensatory magnetic field includes a component in a first direction substantially parallel to the surface of the sample, and preferably substantially orthogonal to an insensitive axis of the atomic magnetometer, to reduce the effect of components of the primary magnetic field in the first direction.

4. The method of claim 3, wherein By'=0, wherein By' is a component of $\vec{B'}$ in the first direction, $\vec{B'}=\vec{B}+\vec{B_C}$, $\vec{B}$ is the primary magnetic field, and $\vec{B_C}$ is the compensatory magnetic field.

5. A method of detecting a material response, including:
providing an oscillating primary magnetic field to cause a sample to produce a secondary magnetic field;
reducing the effect on an atomic magnetometer of components of the primary and secondary magnetic fields in a direction substantially orthogonal to a surface of the sample;
detecting the secondary magnetic field with the atomic magnetometer to detect the material response;
wherein reducing the effect on an atomic magnetometer of components of the primary and secondary magnetic fields in a direction substantially orthogonal to a surface of a sample includes:
aligning an insensitive axis of the atomic magnetometer with a direction substantially orthogonal to the surface of the sample; and
providing a compensatory magnetic field at the atomic magnetometer including a component in a first direction substantially parallel to the surface of the sample, the compensatory magnetic field reducing the effect of components of the primary magnetic field in the first direction.

6. The method of claim 5, wherein By'=0, wherein By' is a component of $\vec{B'}$ in the first direction, $\vec{B'}=\vec{B}+\vec{B_C}$, $\vec{B}$ is the primary magnetic field, and $\vec{B_C}$ is the compensatory magnetic field.

7. The method of claim 5, wherein the compensatory magnetic field includes a component in a second direction substantially parallel to the surface of the sample, the second direction being substantially orthogonal to the first direction, the compensatory magnetic field reducing the effect of components of the primary magnetic field in the second direction.

8. The method of claim 7, wherein Bx'=0, wherein Bx' is a component of $\vec{B'}$ in the second direction, $\vec{B'}=\vec{B}+\vec{B_C}$, $\vec{B}$ is the primary magnetic field, and $\vec{B_C}$ is the compensatory magnetic field.

9. A system for detecting a material response, including:
a magnetic field source for providing an oscillating primary magnetic field to cause a sample to produce a secondary magnetic field;
an atomic magnetometer for detecting the secondary magnetic field for detecting the material response;
wherein the system is configured to reduce the effect on the atomic magnetometer of components of the primary and secondary magnetic fields in a primary direction substantially orthogonal to a surface of the sample; and
including a compensatory magnetic field source for providing a compensatory magnetic field at the atomic magnetometer including a component in a first direction substantially orthogonal to the primary direction to reduce the effect of components of the primary magnetic field in the first direction.

10. The system of claim 9, wherein the compensatory magnetic field source is for providing a compensatory magnetic field at the atomic magnetometer including a component in a second direction substantially orthogonal to the primary direction to reduce the effect of components of the primary magnetic field in the second direction, the second direction being substantially orthogonal to the first direction.

* * * * *